(12) United States Patent
Doo et al.

(10) Patent No.: US 9,767,050 B2
(45) Date of Patent: Sep. 19, 2017

(54) MEMORY SYSTEMS THAT ADJUST AN AUTO-REFRESH OPERATION RESPONSIVE TO A SELF-REFRESH OPERATION HISTORY

(71) Applicant: Samsung Electronics Co., Ltd., Suwon-si, Gyeonggi-do (KR)

(72) Inventors: Su-Yeon Doo, Seoul (KR); Tae-Young Oh, Seoul (KR); Kwang-Il Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/065,211

(22) Filed: Mar. 9, 2016

(65) Prior Publication Data

US 2017/0062038 A1 Mar. 2, 2017

(30) Foreign Application Priority Data

Aug. 24, 2015 (KR) .................. 10-2015-0118636

(51) Int. Cl.
   *G11C 7/00* (2006.01)
   *G06F 13/16* (2006.01)
   *G11C 11/406* (2006.01)

(52) U.S. Cl.
   CPC .... *G06F 13/1636* (2013.01); *G11C 11/40603* (2013.01); *G11C 11/40611* (2013.01); *G11C 11/40615* (2013.01)

(58) Field of Classification Search
   CPC ........... G06F 13/1636; G11C 11/40603; G11C 11/40615; G11C 11/40611
   See application file for complete search history.

(56) References Cited

U.S. PATENT DOCUMENTS

| 6,721,223 B2 | 4/2004 | Matsumoto et al. |
| 7,543,106 B2 | 6/2009 | Choi |
| 7,679,133 B2 | 3/2010 | Son et al. |
| 7,742,356 B2 | 6/2010 | Dono et al. |
| 8,171,211 B2 | 5/2012 | Walker |
| 8,358,554 B2 | 1/2013 | Kim et al. |

(Continued)

FOREIGN PATENT DOCUMENTS

| JP | 7-93971 A | 4/1995 |
| JP | 2000-76850 A | 3/2000 |

(Continued)

*Primary Examiner* — Kretelia Graham
(74) *Attorney, Agent, or Firm* — Myers Bigel, P.A.

(57) ABSTRACT

A memory system includes a semiconductor memory device and a memory controller. The semiconductor memory device includes a plurality of dynamic memory cells. The memory controller controls the semiconductor memory device. The memory controller applies an auto-refresh command to the semiconductor memory device at each refresh interval of the semiconductor memory device such that the semiconductor memory performs a refresh operation in a normal mode, and does not apply the auto-refresh command to the semiconductor memory device during a self-refresh interval in which the semiconductor memory performs a self-refresh operation. After the semiconductor memory device exits from the self-refresh interval, the memory controller adjusts an application of the auto-refresh command in the normal mode by reflecting information of the self-refresh interval.

10 Claims, 14 Drawing Sheets

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 8,705,302 B2 | 4/2014 | Kang et al. |
| 2005/0108460 A1* | 5/2005 | David .................. G11C 11/406 711/5 |
| 2006/0143372 A1* | 6/2006 | Walker .................. G11C 11/406 711/106 |
| 2007/0242547 A1 | 10/2007 | Ahn et al. |
| 2011/0233648 A1 | 9/2011 | Seol et al. |

FOREIGN PATENT DOCUMENTS

| | | |
|---|---|---|
| KR | 10-2006-0088968 A | 8/2006 |
| KR | 10-0656425 B1 | 10/2006 |
| KR | 10-0810060 B1 | 2/2008 |

\* cited by examiner

MEMORY SYSTEMS THAT ADJUST AN AUTO-REFRESH OPERATION RESPONSIVE TO A SELF-REFRESH OPERATION HISTORY

CROSS-REFERENCE TO RELATED APPLICATION(S)

This US non-provisional application claims the benefit of priority under 35 USC §119 to Korean Patent Application No. 10-2015-0118636, filed on Aug. 24, 2015, in the Korean Intellectual Property Office, the content of which is incorporated herein in its entirety by reference.

BACKGROUND

Example embodiments relate to memory devices, and more particularly to memory systems including semiconductor memory devices and memory controllers.

A volatile memory device such as a dynamic random access memory (DRAM) needs to perform a refresh operation to retain stored data. For the refresh operation, a memory controller periodically provides the memory device with a refresh command in a normal access mode to refresh the memory device, and the memory device internally performs a refresh operation in a self-refresh interval in which a power consumption is low. Specifically, in an auto-refresh mode, a refresh is executed in response to an external refresh command that is supplied from outside the memory device. The auto-refresh mode may be performed between read and write operations. On the other hand, in the self-refresh mode, a refresh is executed in response to an internal refresh command that is automatically generated by the DRAM device. The self-refresh mode may be executed when the DRAM is in a powered-down state.

When the memory controller issues a self-refresh command frequently, the power consumption may increase.

SUMMARY

Some example embodiments may provide a memory system, capable of adjusting an refresh operation by reflecting a self-refresh entry history.

According to example embodiments, a memory system includes a semiconductor memory device and a memory controller. The semiconductor memory device includes a plurality of dynamic memory cells. The memory controller controls the semiconductor memory device. The memory controller applies an auto-refresh command to the semiconductor memory device at each refresh interval of the semiconductor memory device such that the semiconductor memory performs a refresh operation in a normal mode, and refrains from applying the auto-refresh command to the semiconductor memory device during a self-refresh interval in which the semiconductor memory device performs a self-refresh operation. After the semiconductor memory device exits from the self-refresh interval, the memory controller adjusts an application of the auto-refresh command in the normal mode responsive to information related to the self-refresh interval.

In example embodiments, the memory controller may include a refresh timer, a command generator, a scheduler and a control circuit. The refresh timer may generate a refresh clock signal toggling at successive refresh intervals. The command generator may generate the auto-refresh command in synchronization with the refresh clock signal. The scheduler may schedule commands from the command generator and the commands may include the auto-refresh command. The control circuit may control the refresh timer, the command generator and the scheduler. The command generator may selectively halt the refresh timer in the self-refresh interval based on a comparison of the refresh interval and the self-refresh interval.

The command generator may run the refresh timer without interruption when the self-refresh interval is smaller than the refresh interval.

When the semiconductor memory device enters into the self-refresh interval after the semiconductor memory device performs an auto-refresh operation on a first memory cell row of the plurality of dynamic memory cells at a first refresh time, the memory controller may be further configured to provide a self-refresh operation on a second memory cell row in the self-refresh interval to replace an auto-refresh operation to be performed on the second memory cell row at a second refresh time after the first refresh time.

When the semiconductor memory device enters into the self-refresh interval after the semiconductor memory device performs an auto-refresh operation on a first memory cell row of the plurality of dynamic memory cells at a first refresh time and the semiconductor memory device exits from the self-refresh interval after prior to a second refresh time after the first refresh time, the memory controller may be further configured to provide a self-refresh operation on the second memory cell row in the self-refresh interval to replace an auto-refresh operation to be performed on the second memory cell row at the second refresh time.

When the self-refresh interval is smaller than the refresh interval, the command generator may halt the refresh timer at a first time at which the self-refresh interval exceeds the refresh interval, and may run the refresh timer again at a second time at which the semiconductor memory device exits from the self-refresh interval.

A sum of a first interval from a first rising transition time of the refresh clock signal immediately before the semiconductor memory device enters into the self-refresh interval to a time when the semiconductor memory device enters into the self-refresh interval and a second interval from the second time to a second rising transition time of the refresh clock signal immediately after the semiconductor memory device exits from the self-refresh interval may correspond to the refresh interval.

In example embodiments, the memory controller may apply a self-refresh entry command to the semiconductor memory device such that the semiconductor memory device performs the self-refresh operation and may apply a self-refresh exit command to the semiconductor memory device such that the semiconductor memory device exits from the self-refresh interval.

In example embodiments, the semiconductor memory device may include a memory cell array, a control logic circuit and a refresh control circuit. The memory cell array may include a plurality of bank arrays having the plurality of dynamic memory cells. The control logic circuit may control an access to the memory cell array based on a command from the memory controller. The refresh control circuit may perform the refresh operation on the plurality of dynamic memory cells under control of the control logic circuit.

The refresh control circuit may include an oscillator, a refresh clock generator and a refresh counter. The oscillator may be enabled to generate a clock signal in response to a self-refresh entry signal from the control logic circuit and may be disabled in response to a self-refresh exit signal from the control logic circuit. The refresh clock generator may generate a refresh clock signal in response to an auto-refresh signal from the control logic circuit and the clock signal. The refresh counter may generate a refresh row address designating a memory cell row to be refreshed in response to the refresh clock signal.

The oscillator may provide the clock signal to the refresh clock generator in the self-refresh interval.

A refresh operation performed in response to the auto-refresh command and the self-refresh operation may correspond to an all bank refresh operation performed on the plurality of bank arrays. The memory cell array may be a three-dimensional memory cell array.

According to other example embodiments, a memory system includes a semiconductor memory device and a memory controller. The semiconductor memory device includes a plurality of bank arrays, each including a plurality of dynamic memory cells. When the memory controller sequentially performs per-bank refresh operation on each of the bank arrays, if the memory controller does not receive an access request other than a request to direct the per-bank refresh operation before the per-bank refresh operation is completed on all of the bank arrays, the memory controller may refresh some bank arrays of the bank arrays, which are not refreshed by the per-bank refresh operation, by issuing one all-bank refresh command to the semiconductor memory device.

In example embodiments, the semiconductor memory device may enter into a power-down mode simultaneously with performing a refresh operation on the some bank arrays, in response to the all-bank refresh command.

In example embodiments, the memory controller may include a refresh timer, a command generator, a scheduler and a control circuit. The refresh timer may generate a refresh clock signal toggling at successive refresh intervals of the semiconductor memory device. The command generator may generate the auto-refresh command in synchronization with the refresh clock signal. The scheduler may schedule commands from the command generator, the commands may include the refresh command and the scheduler may include a command queue that stores the commands. The control circuit may control the refresh timer, the command generator and the scheduler. The command generator may issue the all bank refresh command when the command queue does not store access requests other than a request that directs the per-bank refresh operation before the per-bank refresh operation is completed on all of the bank arrays.

According to yet other example embodiments, a memory system includes a semiconductor memory device and a memory controller. The semiconductor memory device includes a plurality of dynamic memory cells. The memory controller is configured to selectively skip a first in a series of auto-refresh commands that are periodically applied by the memory controller to the semiconductor memory device at a rate corresponding to an auto-refresh interval, responsive to the semiconductor memory device reentering an auto-refresh mode after exiting a self-refresh mode that is shorter in duration than the auto-refresh interval.

In example embodiments, the memory controller comprises a refresh timer configured to generate a refresh clock signal toggling at successive refresh intervals, wherein the refresh timer is configured to selectively halt the refresh clock signal in the self-refresh interval based on a comparison of the auto-refresh interval and the duration of the self-refresh mode.

In example embodiments, the refresh timer is configured to run the refresh clock signal without interruption when the duration of the self-refresh mode is smaller than the auto refresh interval.

In example embodiments, when the semiconductor device enters into the self-refresh mode after the semiconductor memory device performs an auto-refresh operation on a first memory cell row of the plurality of dynamic memory cells at a first refresh time, the memory controller is further configured to provide a self-refresh operation on a second memory cell row in the self-refresh mode to replace an auto-refresh operation to be performed on the second memory cell row at a second refresh time after the first refresh time.

In example embodiments, when the duration of the self-refresh mode is greater than the auto-refresh interval, the refresh timer is further configured to halt the refresh clock at a first time at which the duration of the self-refresh mode exceeds the auto-refresh interval, and is further configured to run the refresh clock again at a second time at which the semiconductor memory device exits from the self-refresh mode.

Accordingly, the memory system may adjust auto-refresh operations in a normal mode by reflecting information of a self-refresh interval during the semiconductor memory device performs a self-refresh operation, to reduce refresh current.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
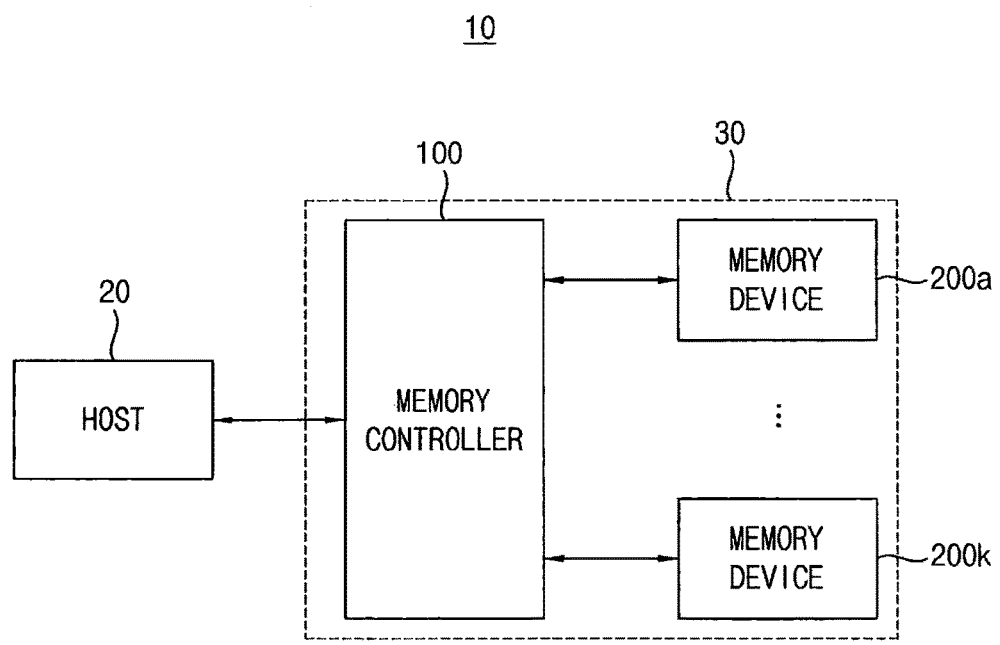
FIG. 1 is a block diagram illustrating an electronic system according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. These example embodiments are just that—examples—and many implementations and variations are possible that do not require the details provided herein. It should also be emphasized that the present disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the present disclosure. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an electronic system according to example embodiments.

Referring to FIG. 1, an electronic system 10 may include a host 20 and a memory system 30. The memory system 30 may include a memory controller 100 and a plurality of semiconductor memory devices 200a~200k.

The host 20 may communicate with the memory system 30 through various interface protocols such as Peripheral Component Interconnect-Express (PCI-E), Advanced Technology Attachment (ATA), Serial ATA (SATA), Parallel ATA (PATA) and/or serial attached SCSI (SAS). In addition, the host 20 may also communicate with the memory system 30 through interface protocols such as Universal Serial Bus (USB), Multi-Media Card (MMC), Enhanced Small Disk Interface (ESDI) and/or Integrated Drive Electronics (IDE).

The memory controller 100 may control an overall operation of the memory system 30. The memory controller 100 may control an overall data exchange between the host 20 and the plurality of semiconductor memory devices 200a~200k. For example, the memory controller 100 may write data in the plurality of semiconductor memory devices 200a~200k and/or read data from the plurality of semiconductor memory devices 200a~200k in response to request from the host 20.

In addition, the memory controller 100 may issue operation commands to the plurality of semiconductor memory devices 200a~200k for controlling the plurality of semiconductor memory devices 200a~200k.

In some embodiments, each of the plurality of semiconductor memory devices 200a~200k may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM) and/or a Rambus dynamic random access memory (RDRAM), etc.

Figure 2:
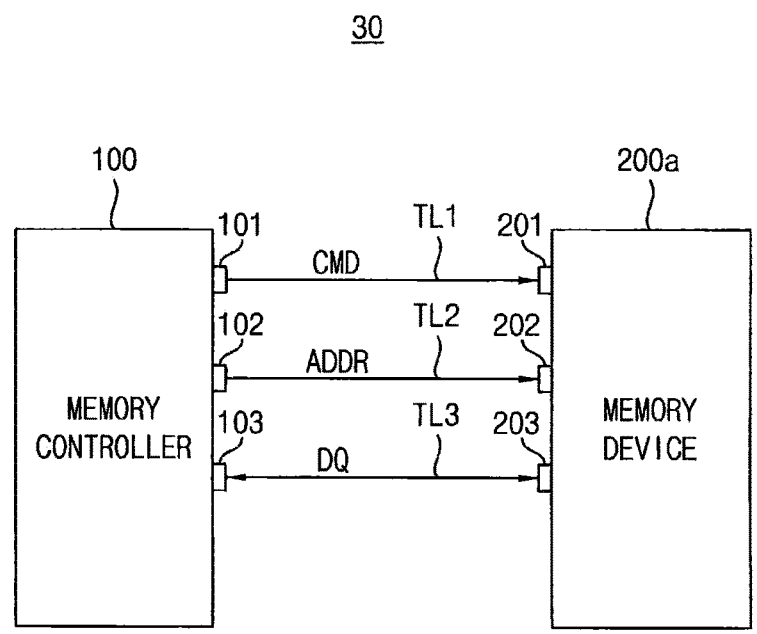
FIG. 2 is a block diagram illustrating an example of the memory system in FIG. 1 according to example embodiments.

FIG. 2 is a block diagram illustrating an example of the memory system in FIG. 1 according to example embodiments.

In FIG. 2, only one semiconductor memory device 200a in communication with the memory controller 100 is illustrated for convenience. However, the details discussed herein related to semiconductor memory device 200a may equally apply to the other semiconductor memory devices 200b~200k.

Referring to FIG. 2, the memory system 30 may include the memory controller 100 and the semiconductor memory device 200a. Each of the memory controller 100 and the semiconductor memory device 200a may be formed as a separate semiconductor chip or as a separate group of chips (e.g., semiconductor memory device 200a may a stack of semiconductor chips in a semiconductor package). The memory controller 100 and the semiconductor memory device 200a may be connected to each other through corresponding command pins 101 and 201, corresponding address pins 102 and 202, corresponding data pins 103 and 203 and corresponding separate pins 104 and 204. The command pins 101 and 201 may transmit a command signal CMD through a command transmission line TL1, the address pins 102 and 202 may transmit an address signal ADDR through an address transmission line TL2, and the data pins 103 and 203 may exchange data DQ through a data transmission line TL3.

Referring to FIGS. 1 and 2, the memory controller 100 may input data to the semiconductor memory device 200a or may output data from the semiconductor memory device 200a through the data pins 103 and 203 based on the request from the host 20. In addition, the semiconductor memory device 200a may receive address from the memory controller 100 through the address pins 102 and 202.

Figure 3:
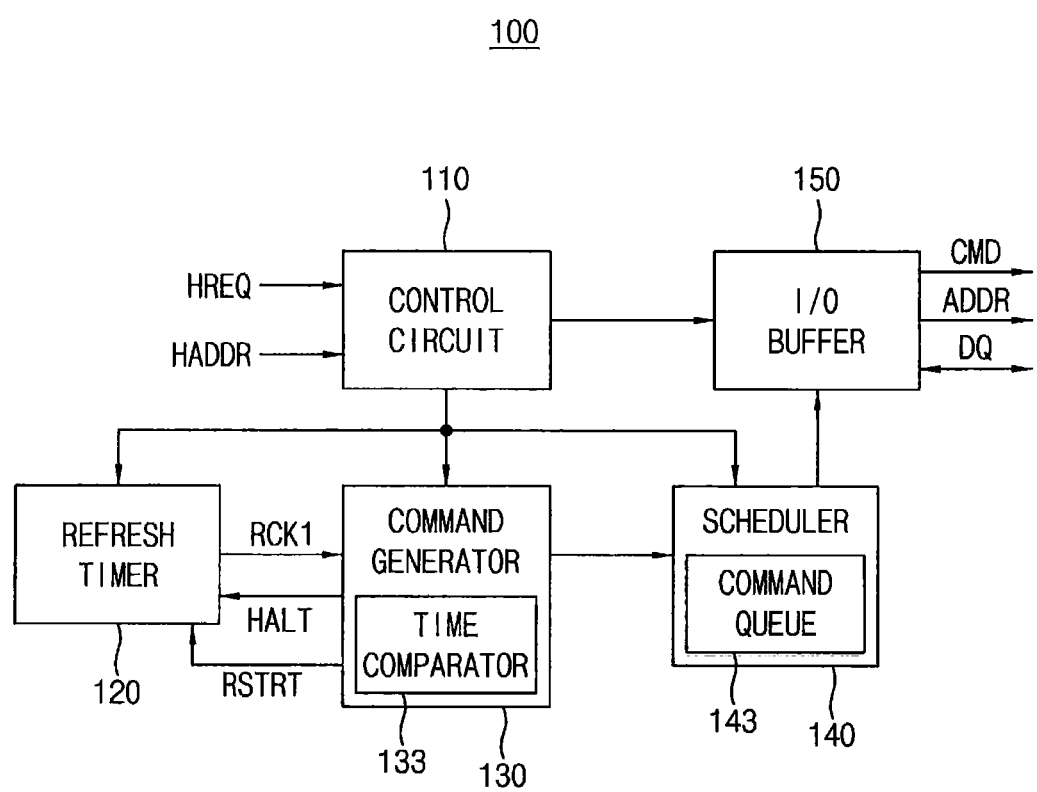
FIG. 3 is a block diagram illustrating an example of the memory controller in FIG. 2 according to example embodiments.

FIG. 3 is a block diagram illustrating an example of the memory controller in FIG. 2 according to example embodiments.

Referring to FIG. 3, the memory controller 100 may include a control circuit 110, a refresh timer 120, a command generator 130, a scheduler 140 and an input/output (I/O) buffer 150. The command generator 130 may include a time comparator 133 and the scheduler 140 may include a command queue 143.

The refresh timer 120 may generate a first refresh clock signal RCK1 under control of the control circuit 110 and provide the command generator 130 with the first refresh clock signal toggling according to a refresh interval (tREFI) defined in a specification of the semiconductor memory device 200a.

The command generator 130 may provide the scheduler 140 with an auto-refresh command in synchronization with the first refresh clock signal RCK1 in a normal or auto mode. In addition, the command generator 130 may generate commands to the scheduler 140 under control of the control circuit 110 such that the semiconductor memory device 200a performs an active, refresh, read and write operations. When the semiconductor memory device 200a performs a self-refresh operation during a self-refresh interval (a self-refresh interval is also referred to as a self-refresh entry interval) in response to a command from the memory controller 100, the time comparator 133 compares the self-refresh interval with the refresh interval (tREFI) to selectively provide a halt signal HALT to the refresh timer 120 according to a result of comparison of the self-refresh interval and the refresh interval (tREFI).

For example, when the self-refresh interval of the semiconductor memory device 200a is smaller than the refresh interval (tREFI), the command generator 130 may provide the refresh timer 120 with the halt signal HALT with a first logic level (logic low level), and the refresh timer 120 does not halt an operation in response to the halt signal HALT with a first logic level. When the self-refresh interval of the semiconductor memory device 200a is greater than the refresh interval (tREFI), the command generator 130 may provide the refresh timer 120 with the halt signal HALT with a second logic level (logic high level), and the refresh timer 120 halts an operation in response to the halt signal HALT with a second logic level.

After a predetermined time elapses after the semiconductor memory device 200a exits from the self-refresh interval, the command generator 130 may provide the refresh timer 120 with a restart signal RSTRS to resume operation of the refresh timer 120.

The command generator 130 may not apply an auto-refresh command to the scheduler 140 when the command generator 130 receives the first fresh clock signal RCK1 from the refresh timer 120 during the self-refresh interval, because the semiconductor memory device 200a performs refresh operation on the dynamic memory cells using an internal oscillator during the self-refresh interval.

The scheduler 140 stores the commands from the command generator 130 and performs command scheduling.

The control circuit 110 receives a host request HREQ and a host address signal HADDR from the host 20 to control the command generator 130 to generate the commands and the semiconductor memory device 200a may perform an active, refresh, read and write operations based on the commands.

The I/O buffer 150 may temporarily store signals transmitted to the semiconductor memory device 200a or transmitted from the semiconductor memory device 200a. The I/O buffer 150 may be coupled to the semiconductor memory device 200a through the command pin 101, the data pin 102 and the address pin 103. The memory controller 100 transmits the data, the address and the commands to the semiconductor memory device 200a via the I/O buffer 150.

Figure 4:
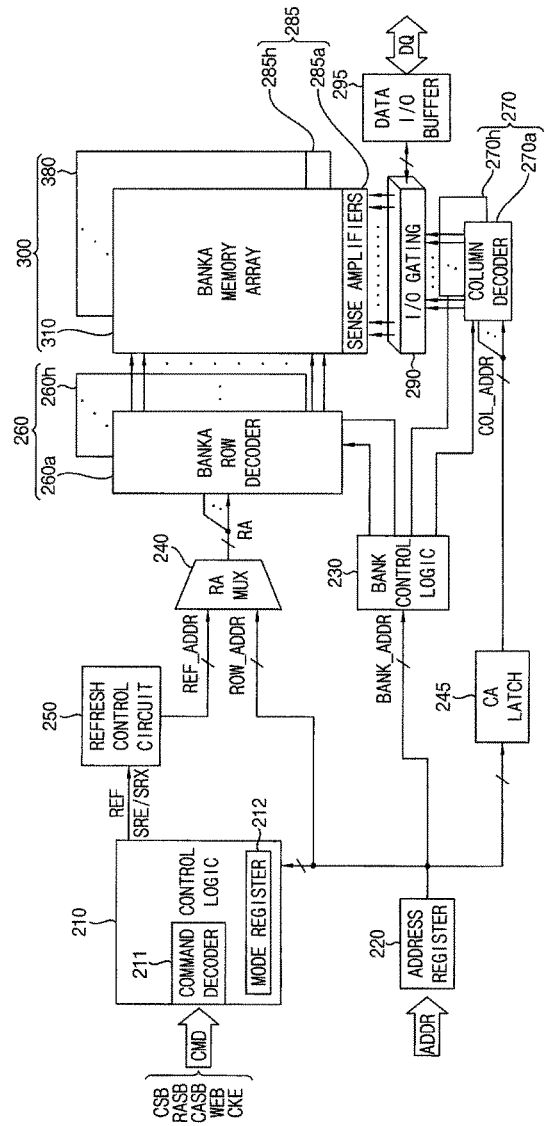
FIG. 4 is a block diagram illustrating an example of the semiconductor memory device in FIG. 2 according to example embodiments.

FIG. 4 is a block diagram illustrating an example of the semiconductor memory device in FIG. 2 according to example embodiments.

Referring to FIG. 4, the semiconductor memory device 200a may include a control logic (or a control logic circuit) 210, an address register 220, a bank control logic 230, a row address multiplexer 240, a column address latch 245, a row decoder 260, a column decoder 270, a memory cell array 300, a sense amplifier unit 285, an input/output (I/O) gating circuit 290, a data input/output (I/O) buffer 295, and a refresh control circuit 250.

The memory cell array 300 may include first through eighth bank arrays 310~380. The row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h may form first through eighth banks. Although the semiconductor memory device 200a is illustrated in FIG. 4 as including eight banks, the semiconductor memory device 200a may include any number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 in order to output data corresponding to the column address COL_ADDR.

The I/O gating circuit 290 may include a circuitry for gating input/output data. The I/O gating circuit 290 may further include read data latches for storing data that is output from the first through eighth bank arrays 310~380, and write drivers for writing data to the first through eighth bank arrays 310~380.

Data DQ to be read from one bank array of the first through eighth bank arrays 310~380 may be sensed by a sense amplifier coupled to the one bank array from which the data is to be read, and may be stored in the read data latches. The data DQ stored in the read data latches may be provided to the memory controller 100 via the data I/O buffer 295. Data DQ to be written in one bank array of the first through eighth bank arrays 310~380 may be provided to the data I/O buffer 295 from the memory controller 100. The write driver may write the data DQ in one bank array of the first through eighth bank arrays 310~380.

The control logic 210 may control operations of the semiconductor memory device 200a. For example, the control logic 210 may generate control signals for the semiconductor memory device 200a in order to perform a write operation or a read operation. The control logic 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (WEB), a row address strobe signal (RASB), a column address strobe signal (CASB), a chip select signal (CSB), etc. The command decoder 211 may generate an auto-refresh command (or auto-refresh signal) REF, a self-refresh entry command (or a self-refresh entry signal) SRE and a self-refresh exit command (or self-refresh exit signal) SRX by decoding the write enable signal (WEB), the row address strobe signal (RASB), the column address strobe signal (CASB), the chip select signal (CSB), etc.

If the signal CKE transits from a high level to a low level when the signals CSB, RASB and CASB are at a low level and the signal WEB is at a high level, the self-refresh entry command SRE is decoded. If the signal CKE transits from a low level to a high level when the signals CSB, RASB and CASB are at a high level and the signal CSB is at a high level or a low level, the self-refresh exit command SRX is decoded. The control logic 210 may provide the refresh control circuit 210 with the auto-refresh signal REF, the self-refresh entry signal SRE and the self-refresh exit signal SRX.

The refresh control circuit 250 may perform a counting operation in response to the auto-refresh signal REF or in response to the self-refresh entry signal SRE in the self-refresh mode to output a refresh row address REF_ADDR.

Figure 5:
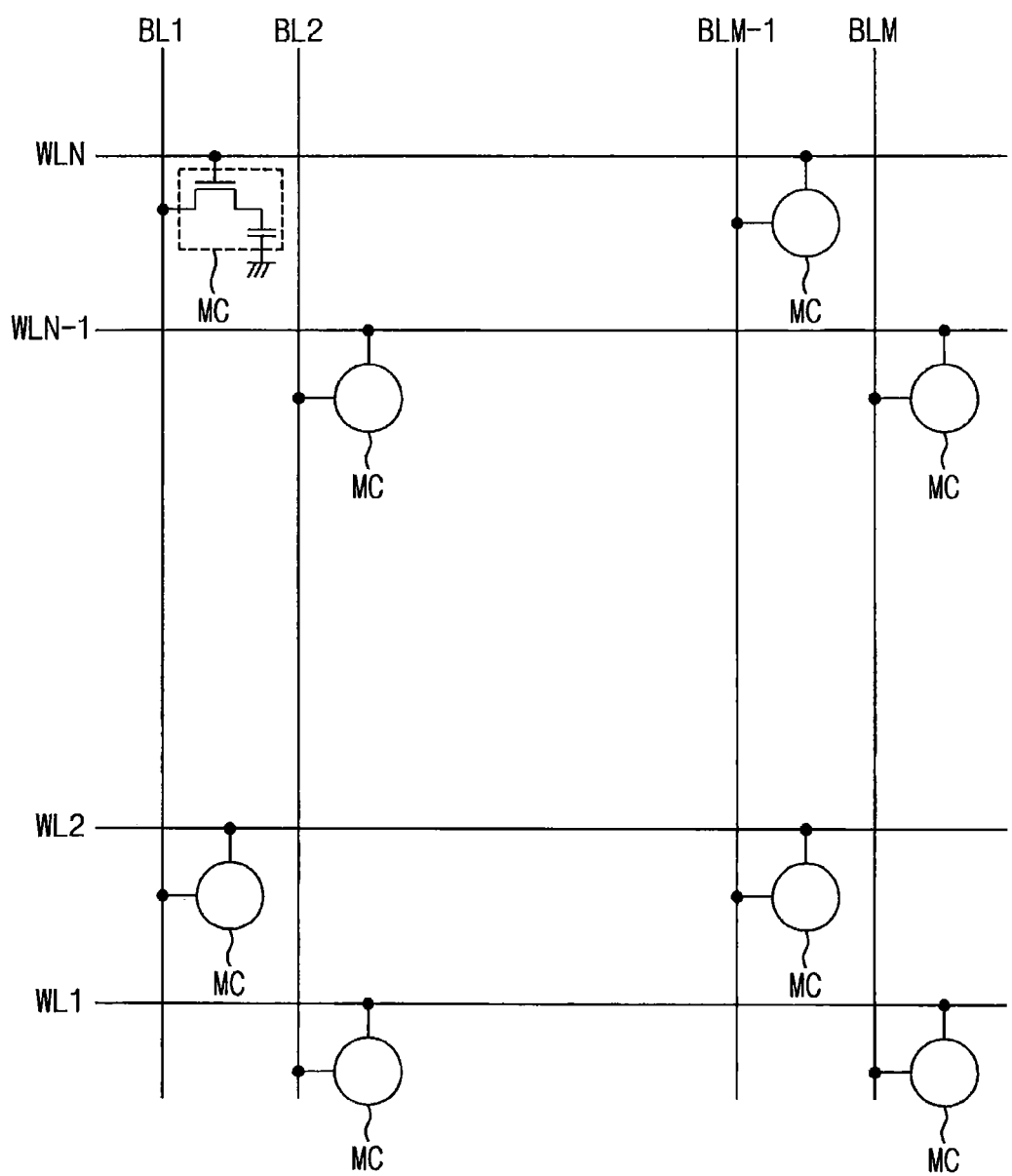
FIG. 5 illustrates the first bank array in the semiconductor memory device of FIG. 4 according to example embodiments.

FIG. 5 illustrates the first bank array in the semiconductor memory device of FIG. 4.

Referring to FIG. 5, the first bank array 310 may include a plurality of word-lines WL1~WLN, a plurality of bit-lines BL1~BLM, and a plurality of memory cells MCs disposed near intersections between the word-lines WL1~WLN and the bit-lines BL1~BLM. In one embodiment, each of the plurality of memory cells MCs may include a dynamic random access memory (DRAM) cell structure. The plurality of word-lines WL1~WLN to which the plurality of memory cells MCs are connected may be defined as rows of the bank array 310, and the plurality of bit-lines BL1~BLM to which the plurality of memory cells MCs are connected may be defined as columns of the bank array.

Figure 6:
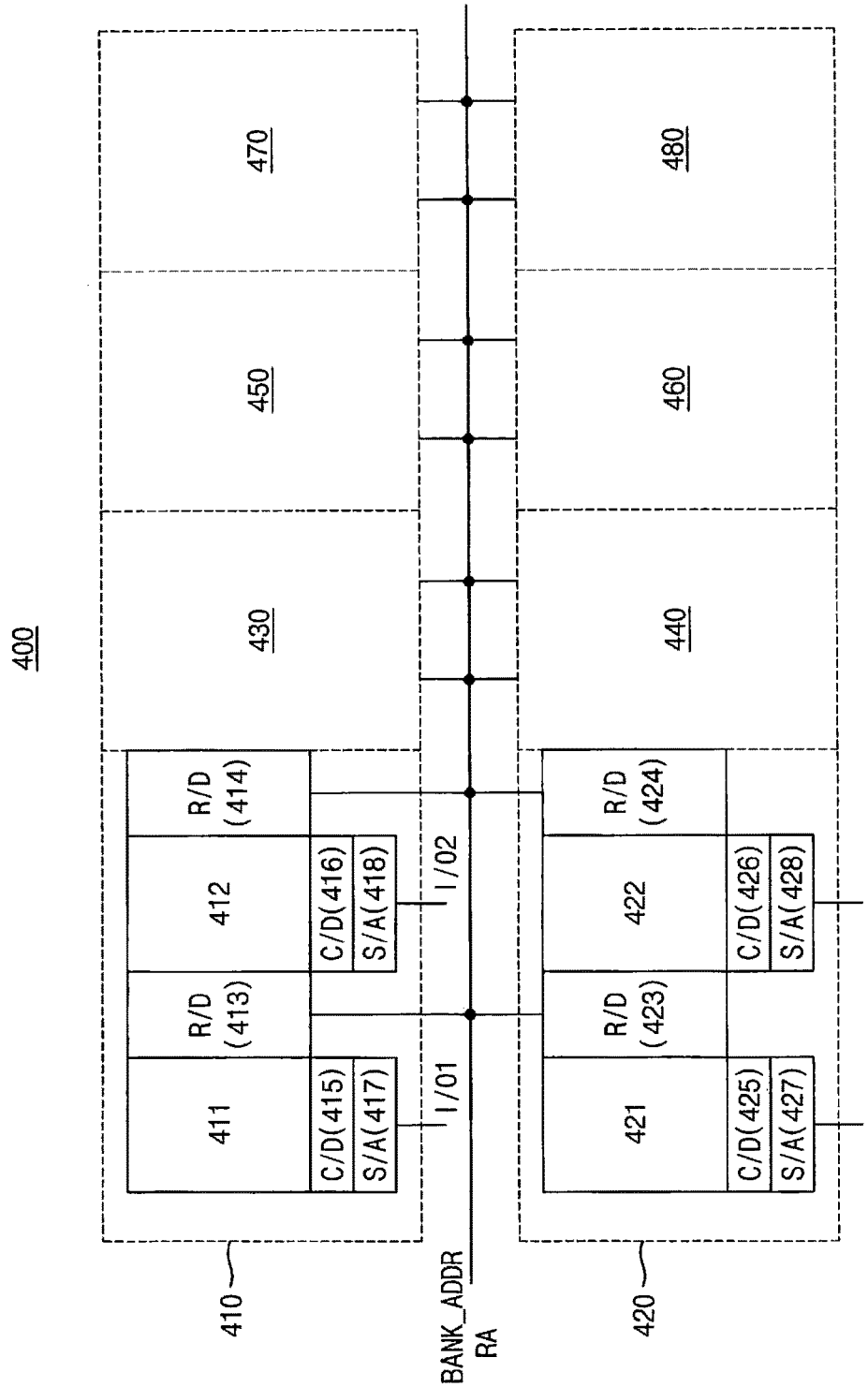
FIG. 6 is a block diagram illustrating an example of the semiconductor memory device of FIG. 4 according to example embodiments.

FIG. 6 is a block diagram illustrating an example of the semiconductor memory device of FIG. 4 according to example embodiments.

Referring to FIG. 6, a semiconductor memory device 400 may include a plurality of banks 410~480 in which a plurality of memory cells are arranged in columns and rows. Each of the plurality of banks 410~480 may include a plurality of word-lines WLs, a plurality of bit-lines BLs, and a plurality of memory cells MCs disposed near intersections between the word-lines WLs and the bit-lines BLs, as shown in FIG. 5. The semiconductor memory device 400 may include eight banks 410~480 in FIG. 6. However, the present disclosure is not limited thereto, and the number of banks included in the semiconductor memory device 400 may be any positive integer.

The first bank 410 of the plurality of banks 410~480 may include a first sub-bank 411, a second sub-bank 412, a first row decoder 413, a second row decoder 414, a first column decoder 415, and a second column decoder 416. In addition, the second bank 420 may include a first sub-bank 421, a second sub-bank 422, a first row decoder 423, a second row decoder 424, a first column decoder 425, and a second column decoder 426. Each configuration of third through eighth 430~480 may be substantially same as each configuration of the first bank 410 and the second bank 420. The first row decoder 413 and the second row decoder 414 may receive the bank address BANK_ADDR and the row address RA. The first column decoder 415 and the second column decoder 416 may receive the column addresses. One of the plurality of banks 410~480 may be selected in response to the bank address BANK_ADDR, and memory cells in the selected bank may be accessed in response to the row address RA and the column address.

The first bank 410 may be divided into a first sub-bank 411 and a second sub-bank 412. The first sub-bank 411 and the second sub-bank 412 may be arranged in a direction, for example, a row direction, in which the plurality of word-lines WLs of the plurality of memory cells MCs are arranged. The first sub-bank 111 may be connected to the first row decoder 413 and the first column decoder 415. Memory cells of the first sub-bank 411 may be addressed by the first row decoder 413 and the first column decoder 415.

The second sub-bank 412 may be connected to the second row decoder 414 and the second column decoder 416. Memory cells of the second sub-bank 412 may be addressed by the second row decoder 414 and the second column decoder 416.

The first sub-bank 411 or the second sub-bank 412 may be selected by any one bit from among the row address signals RA applied to the first row decoder 413 and the second row decoder 414. For example, the first sub-bank 411 or the second sub-bank 412 may be selected by a most significant bit (MSB).

The first sub-bank 411 and the second sub-bank 412 are respectively connected to first and second data line sense amplifier blocks 417 and 418, and are also respectively connected to first and second data input/output lines I/O1 and I/O2 which are independent from each other. Data that is read from the first sub-bank 411 may be output through the first data line sense amplifier block 417 and the first data input/output lines I/O1. Data that is read from the second sub-bank 412 may be output through the second data line sense amplifier 418 and the second data input/output lines I/O2.

Figure 7:
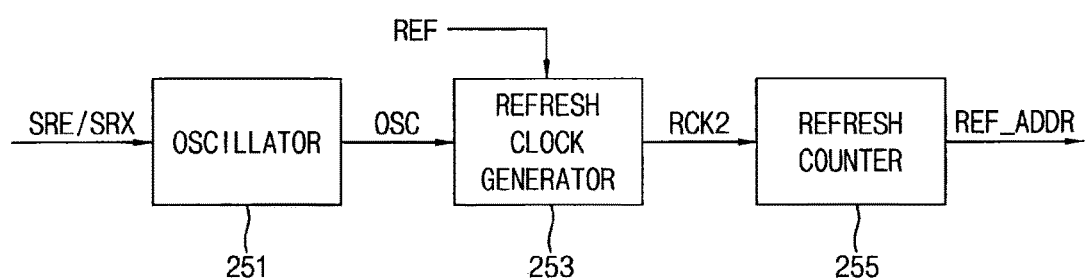
FIG. 7 is a block diagram illustrating an example of the refresh control circuit in the semiconductor memory device of FIG. 4 according to example embodiments.

FIG. 7 is a block diagram illustrating an example of the refresh control circuit in the semiconductor memory device of FIG. 4 according to example embodiments.

Referring to FIG. 7, the refresh control circuit 250 may include an oscillator 251, the refresh clock generator 253 and a refresh counter 255.

The oscillator 251 may be enabled to generate a clock signal OSC in response to the self-refresh entry signal SRE from the control logic 210 and may be disabled in response to the self-refresh exit signal SRX from the control logic 210. The oscillator 251 may be enabled to generate the clock signal OSC only when the semiconductor memory device 200a enters into a self-refresh mode.

The refresh clock generator 253 may generate a second refresh clock signal RCK2 in response to the auto-refresh signal REF or the clock signal OSC. The refresh clock generator 253 generates the second refresh clock signal RCK2 in response to the auto-refresh signal REF which is applied according to a refresh interval tREFI in a normal mode of the semiconductor memory device 200a and generates the second refresh clock signal RCK2 in response to the clock signal OSC in the self-refresh mode of the semiconductor memory device 200a. Therefore, a period of the second refresh clock signal RCK2 is same as a period of the first refresh clock signal RCK1 in the normal mode and is same as a period of the clock signal OSC in the self-refresh mode.

The refresh counter 255 may generate a refresh row address REF_ADDR designating a memory cell row to be refreshed at every rising edge of the second refresh clock signal RCK2 by performing a counting operation in response to the second refresh clock signal RCK2.

Figure 8A:
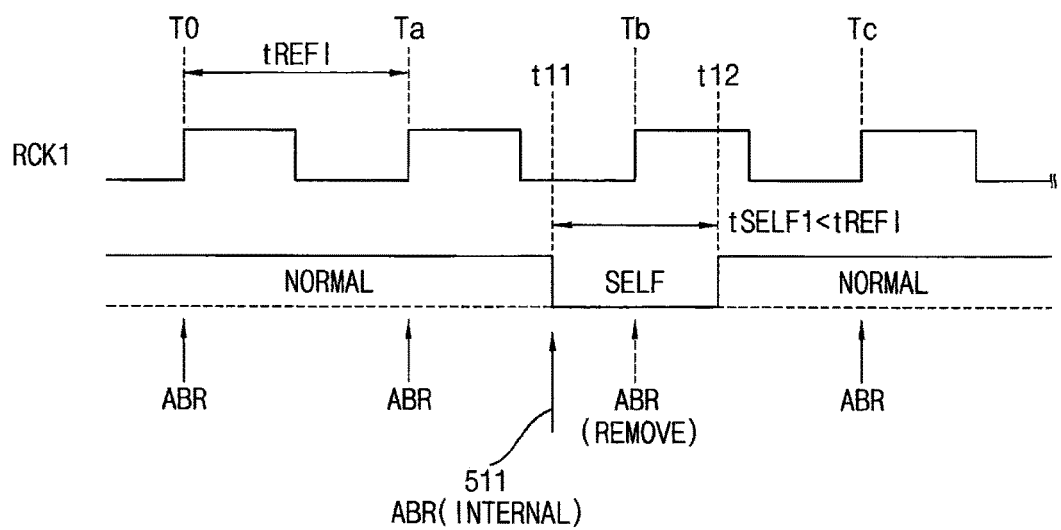
FIGS. 8A through 8C are timing diagrams that illustrate how a refresh operation is performed in the memory system of FIG. 2 according to example embodiments.
Figure 8B:
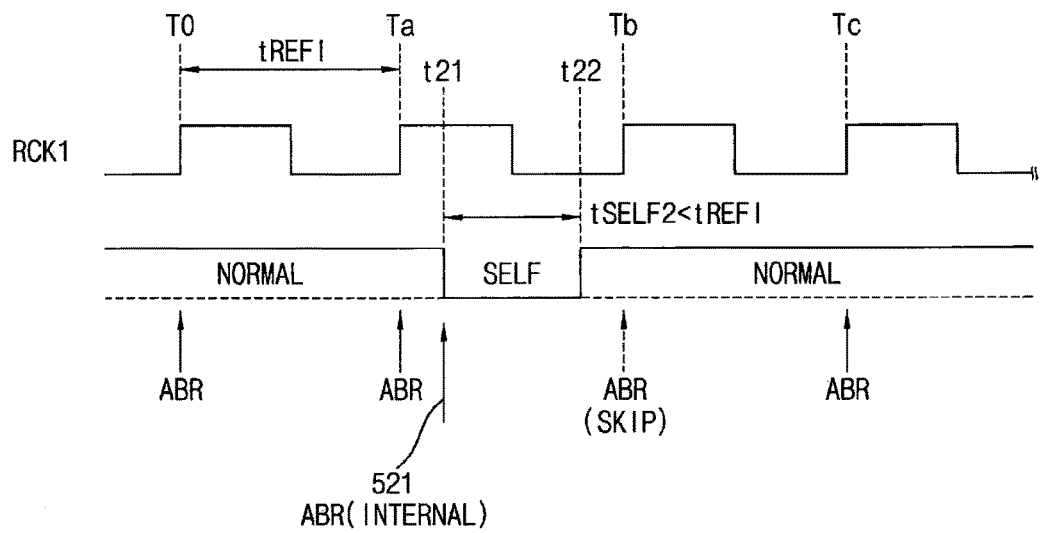
Figure 8C:
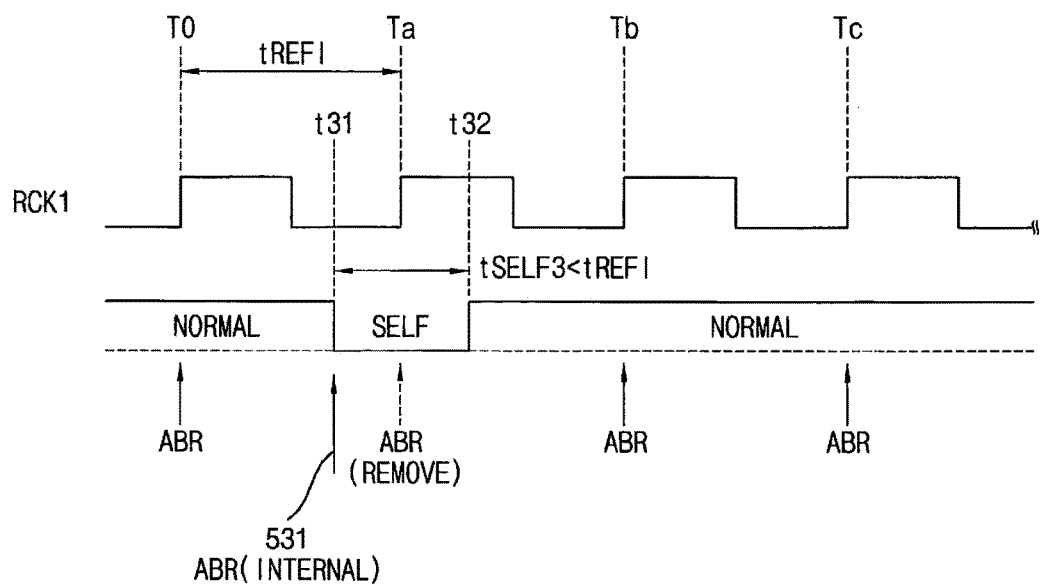

FIGS. 8A through 8C respectively illustrate that a refresh operation is performed in the memory system of FIG. 2.

Referring to FIGS. 2 through 8A, the refresh timer 120 generates the first refresh clock signal RCK1 which has a rising edge at each of timings T0, Ta, Tb and Tc. That is, the refresh timer 120 generates the first refresh clock signal RCK1 toggling with a period of the refresh interval tREFI. The memory controller 100 applies an all-bank refresh command ABR at each of the timings T0 and Ta (also referred to as a first refresh timing) such that the memory cell rows of the semiconductor memory device 200a are sequentially refreshed.

The memory controller 100 and the semiconductor memory device 200a operate in the normal mode until a timing t11, the memory controller 100 and the semiconductor memory device 200a enter into a self-refresh mode at the timing t11 and the memory controller 100 and the semiconductor memory device 200a operate in a self-refresh mode until a timing t12. When the semiconductor memory device 200a enters into the self-refresh mode, the semiconductor memory device 200a performs a self-refresh operation on the memory cell rows as indicated by a reference numeral 511. The self-refresh operation may be an all-bank refresh operation performed on all of the bank arrays 310~380.

In a self-refresh interval tSELF1 during which the semiconductor memory device 200a performs the self-refresh operation, the command generator 130 in the memory controller 100 does not apply the auto-refresh command ABR to the semiconductor memory device 200a at the timing Tb. That is, the self-refresh operation on a memory cell row (a second memory cell row) in the self-refresh interval tSELF1 replaces an auto-refresh operation to be performed on the second memory cell row at the timing (i.e., a second refresh timing) Tb successive to the timing (i.e., the first refresh timing) Ta. Since the self-refresh interval tSELF1 is smaller than the refresh interval tREFI, the command generator 133 provides the refresh timer 120 with the halt signal HALT with a low level.

The semiconductor memory device 200a exits from the self-refresh mode in response to the self-refresh exit signal SRX at the timing t12, enters into the normal mode, and performs a self-refresh operation on a corresponding memory cell row in response to the auto-refresh command at the timing (i.e., a third refresh timing) Tc.

Referring to FIGS. 2 through 7 and 8B, the memory controller 100 and the semiconductor memory device 200a operate in the self-refresh mode during a self-refresh interval tSELF2 from a timing t21 to a timing t22, the semiconductor memory device 200a performs the self-refresh operation on a memory cell row at the instant the semiconductor memory device 200a enters into the self-refresh mode as indicated by a reference numeral 521. After the timing t22, the memory controller 100 and the semiconductor memory device 200a operate in the normal mode, and the command generator 130 in the memory controller 100 may skip an application of the auto-refresh command at the timing Tb to reduce a refresh current.

That is, the self-refresh operation on a memory cell row in the self-refresh interval tSELF2 replaces an auto-refresh operation to be performed on the second memory cell row at the timing Tb. For example, when the self-refresh operation is performed on two memory cell rows in the self-refresh interval tSELF2, the command generator 130 in the memory controller 100 may skip an application of the auto-refresh command ABR at each of the timing Tb and Tc in the normal mode.

Referring to FIGS. 2 through 7 and 8C, the memory controller 100 and the semiconductor memory device 200a operate in the self-refresh mode during a self-refresh interval tSELF3 from a timing t31 to a timing t32, the semiconductor memory device 200a performs the self-refresh operation on a memory cell row at the instant the semiconductor memory device 200a enters into the self-refresh mode as indicated by a reference numeral 531. After the timing t32, the memory controller 100 and the semiconductor memory device 200a operate in the normal mode, and the command generator 130 in the memory controller 100 may skip an application of the auto-refresh command ABR at the timing Ta.

That is, the memory controller 100 may skip an application of the auto-refresh command ABR to the semiconductor memory device 200a in the self-refresh interval tSELF3 in the self-refresh interval of the memory system 30. After the semiconductor memory device 200a exist from the self-refresh interval, the memory controller 100 may adjust an application of the auto-refresh command ABR in the normal mode by reflecting information of the self-refresh interval.

Figure 9:
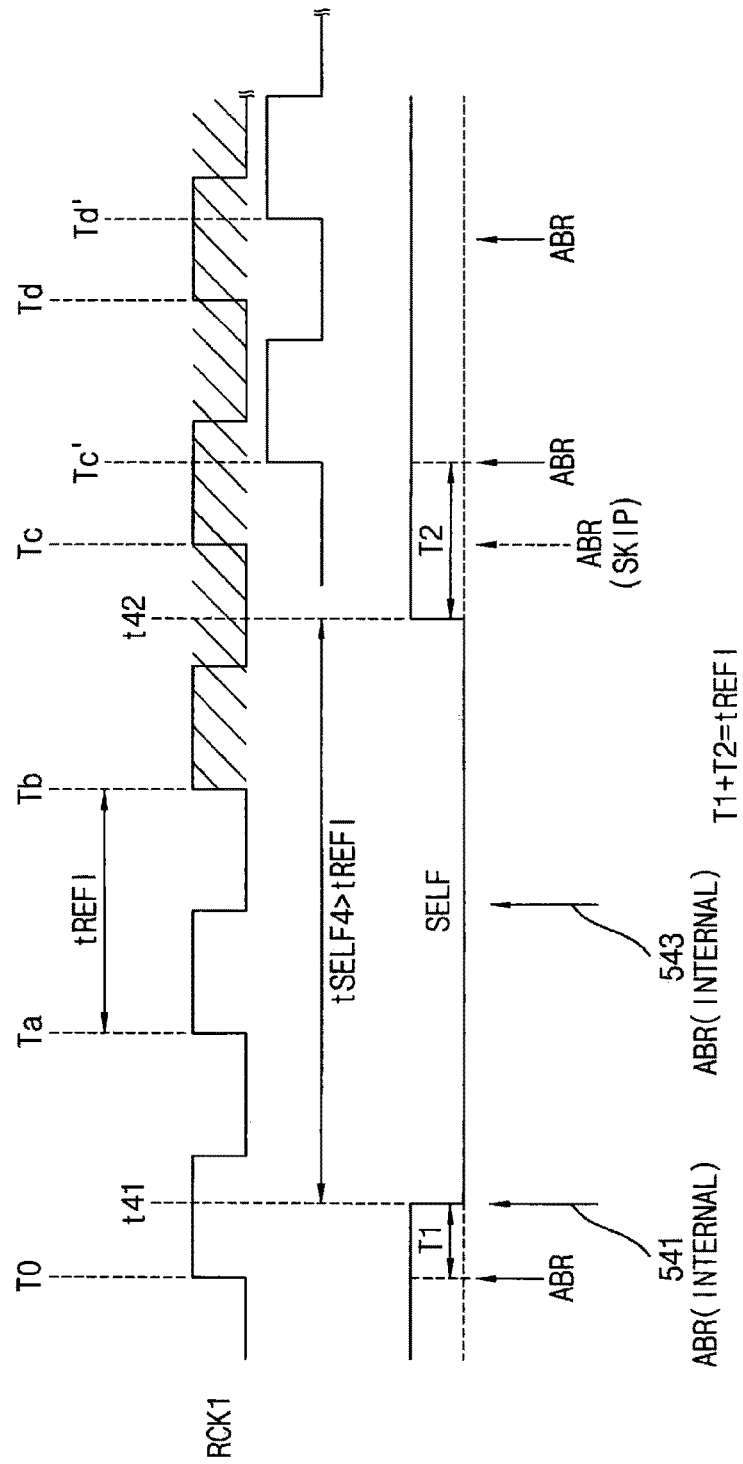
FIG. 9 is a timing diagram that illustrates how a refresh operation is performed in the memory system of FIG. 2 according to example embodiments.

FIG. 9 illustrates that that a refresh operation is performed in the memory system of FIG. 2.

Referring to FIGS. 2 through 7 and 9, the refresh timer 120 generates the first refresh clock signal RCK1 which rises at each of the timings T0 and Ta. The memory controller 100 applies the all-bank refresh command ABR to the semiconductor memory device at the timing T0 to refresh a first memory cell row of the semiconductor memory device 200a.

When a time T1 elapses from the timing T0, the semiconductor memory device 200a enters into the self-refresh mode in response to the self-refresh entry command SRE at a timing t41, and the semiconductor memory device 200a exits from the self-refresh mode in response to the self-refresh exit command SRX at a timing t42 between the timings Tb and Tc. The semiconductor memory device 200a internally performs the self-refresh operation on a second memory cell row and a third memory cell row during a self-refresh interval (tSELF4) as indicated by reference numerals 541 and 543.

Since the self-refresh interval (tSELF4) is greater than the refresh interval (tREFI), the command generator 130 applies the halt signal HALT to the refresh timer 120 at the timing Tb to halt the operation of the refresh timer 120. After a time T2 elapses from the timing t42 when the semiconductor memory device 200a exist from the self-refresh mode, the command generator 130 applies a restart signal RSTRT to the refresh timer 120 to resume operation of the refresh timer 120, the refresh timer 120 may generate the first refresh clock signal RCK1 toggling at a timing Tc' instead of the timing Tc and a timing Td' instead of a timing Td. Therefore, the command generator 130 in the memory controller 100 may skip an application of the auto-refresh command ABR at the timing Tc to reduce a refresh current after the semiconductor memory device 200a exits from the self-refresh interval.

A sum of a first interval T1 from a first rising transition time T0 of the first refresh clock signal RCK1 immediately before the semiconductor memory device 200a enters into the self-refresh interval tREF4 to a timing t41 when the semiconductor memory device enters 200a into the self-refresh interval tREF4 and a second interval T2 from the second timing ty42 to a second rising transition time Tc' of the first refresh clock signal RCK1 immediately after the semiconductor memory device 200a exits from the self-refresh interval corresponds to the refresh interval tREFI.

Figure 10:
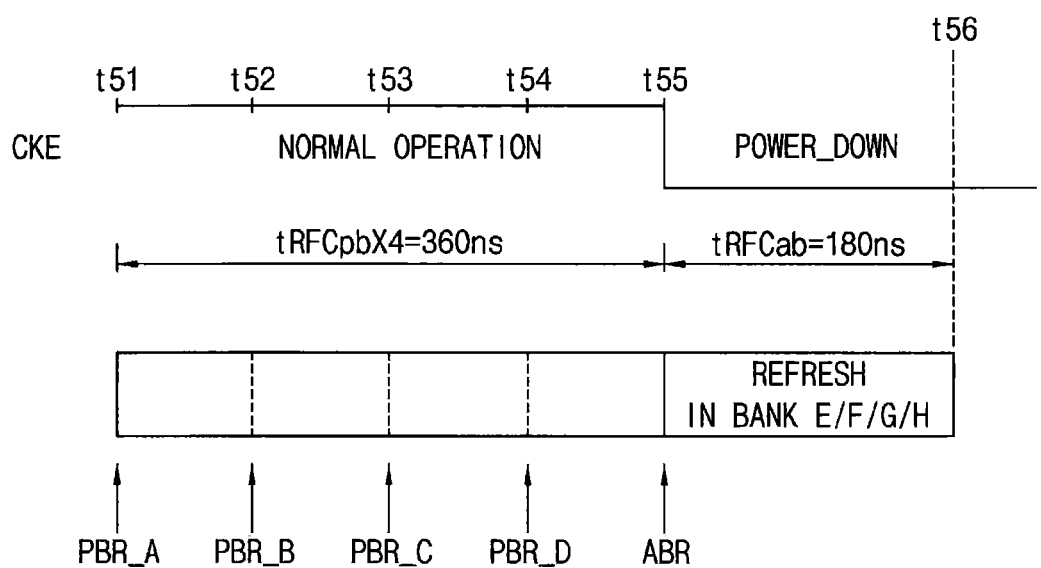
FIGS. 10 and 11 are timing diagrams that illustrate how a refresh operation is performed in the memory system of FIG. 2 according to example embodiments.
Figure 11:
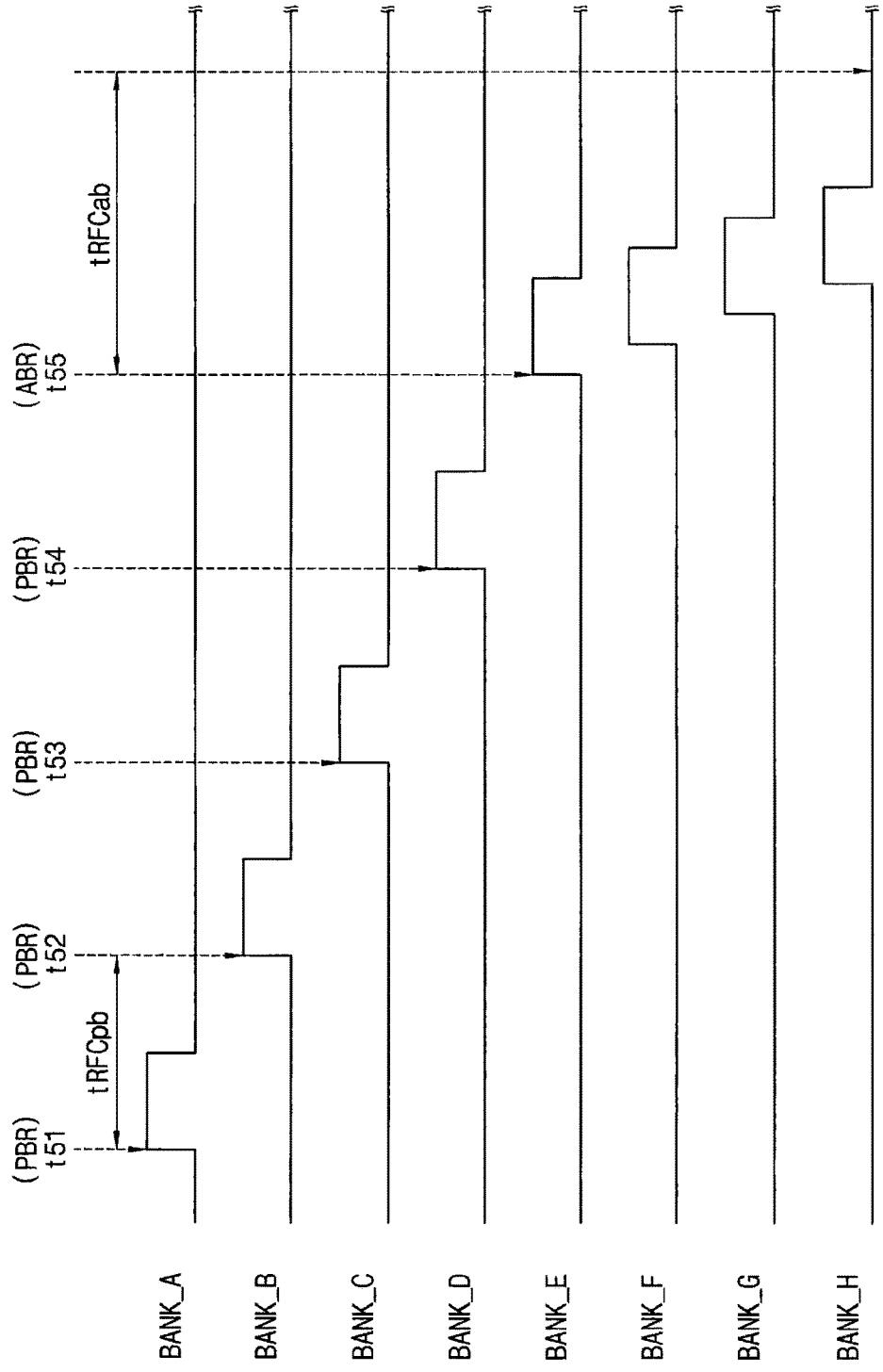

FIGS. 10 and 11 illustrate that that a refresh operation is performed in the memory system of FIG. 2.

Referring to FIGS. 2, 3, 4, 10 and 11, between timings t51~t55 during the clock enable signal CKE is at a high level, the memory controller 100 and the semiconductor memory device 200a and 400 operate in the normal mode and the memory controller 100 and the semiconductor memory device 200a and 400 enter into a power down mode between timings t55~456 during the clock enable signal CKE is at a low level.

During the timings t51~t52, a refresh operation is performed in memory cell rows in a first bank array BANK_A in response to a per-bank refresh command PBR_A from the memory controller 100, a refresh operation is performed in memory cell rows in a second bank array BANK_B in response to a per-bank refresh command PBR_B during the timings t52~t53, a refresh operation is performed in memory cell rows in a third bank array BANK_C in response to a per-bank refresh command PBR_C during the timings t53~t54, and a refresh operation is performed in memory cell rows in a fourth bank array BANK_D in response to a per-bank refresh command PBR_D during the timings t54~t55.

When the memory controller 100 applies the per-bank refresh command PBR to the semiconductor memory device 200a or 400, the memory controller 100 also provides the semiconductor memory device 200a or 400 with information on a bank to be refreshed. When at least one memory cell row in each of the bank arrays BANK_A~BANK_H is to refreshed in the semiconductor memory device 200a or 400 in response to the per-bank refresh command PBR, one per-bank refresh operation is determined to be completed. When the memory system 30 performs the per-bank refresh operation, the memory controller 100 executes the per-bank refresh command PBR on each of the bank arrays BANK_A~BANK_H, and then the memory system 30 enter into the power down mode.

While the per-bank refresh operation is sequentially performed on the bank arrays BANK_A~BANK_H by the memory controller 100, if the memory controller 100 does not receive other access requests than a request to direct the per-bank refresh operation (that is, there is no other access requests than the request to direct the per-bank refresh operation in the command queue 413) before the per-bank refresh operation is completed on all of the bank arrays BANK_A~BANK_H as at the timing t55, the memory controller 100 refreshes some bank arrays BANK_E-~BANK_H of the bank arrays BANK_A~BANK_H, which are not refreshed by the per-bank refresh operation by issuing one all-bank refresh command ABR, by the command generator 130, to the semiconductor memory device 200a. The some bank arrays BANK_E~BANK_H may be refreshed between the timings t55~t56 in response to the all-bank refresh command ABR.

Therefore, the memory system 30 may reduce refresh current because a time required for entering into the power down mode may be smaller than a time required for sequentially performing the per-bank refresh operation on the bank arrays BANK_A~BANK_H. While the semiconductor memory device 200a is in the power down mode, the semiconductor memory device 200a may perform the self-refresh operation based on a clock signal internally generated.

In general, when the memory controller 100 issues the all bank refresh command ABR, the semiconductor memory device 200 internally performs the refresh operation on the bank arrays BANK_A~BANK_H to complete one refresh operation. However, according to present disclosure, if, while the per-bank refresh operation is being performed, the semiconductor memory device 200a enters into the power-down mode simultaneously with performing the refresh operation on the some bank arrays not to be refreshed in the per-bank refresh operation, in response to the all-bank refresh command. Therefore, power consumption may be reduced.

An interval between the timings t51~t52 may correspond to a per-bank refresh cycle tRFCpb and an interval between the timings t55~t56 may correspond to an all bank refresh cycle tRFCab.

Figure 12:
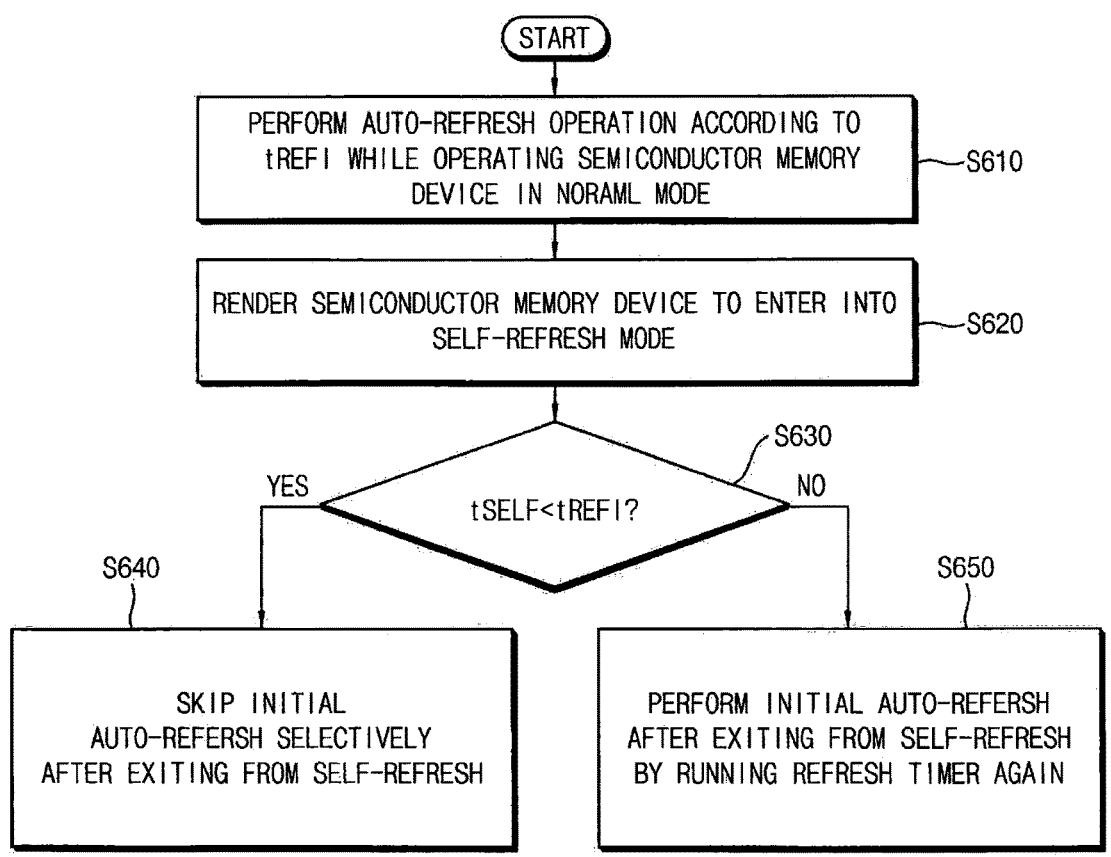
FIG. 12 is a flow chart illustrating performing a refresh operation in a memory system according to example embodiments.

FIG. 12 is a flow chart illustrating systems, devices and methods of performing refresh operation in a memory system according to example embodiments.

Referring to FIGS. 2 to 9 and 12, in performing a refresh operation in a memory system 30 including a semiconductor memory device 200a and a memory controller that controls the semiconductor memory device 200a, the memory controller 100 performs an auto-refresh operation on the semiconductor memory device 200a according to a refresh interval tREFI of the semiconductor memory device 200a while the memory controller 100 renders the semiconductor memory device 200a in a normal mode (S610). The memory controller 100 renders to semiconductor memory device 200a to enter into a self-refresh mode (S620). The memory controller 100 may selectively halt operation of a refresh timer 120 based on a comparison of a self-refresh interval tSELF and the refresh interval tREFI (S630, S640 and S650). The semiconductor memory device 200a performs a self-refresh operation in the self-refresh interval tSELF.

For example, when the self-refresh interval tSELF is smaller than the refresh interval tREFI (YES in S630), the memory controller 100 may skip an initial auto-refresh operation selectively after exiting from the self-refresh without halting the refresh timer 120 while the self-refresh operation is performed in the semiconductor memory device 200a (S640).

For example, when the self-refresh interval tSELF is greater than the refresh interval tREFI (NO in S630), the memory controller 100 may perform an initial auto-refresh operation by running the refresh timer 120 again after exiting from the self-refresh with halting the refresh timer 120 while the self-refresh operation is performed in the semiconductor memory device 200a (S650).

Figure 13:
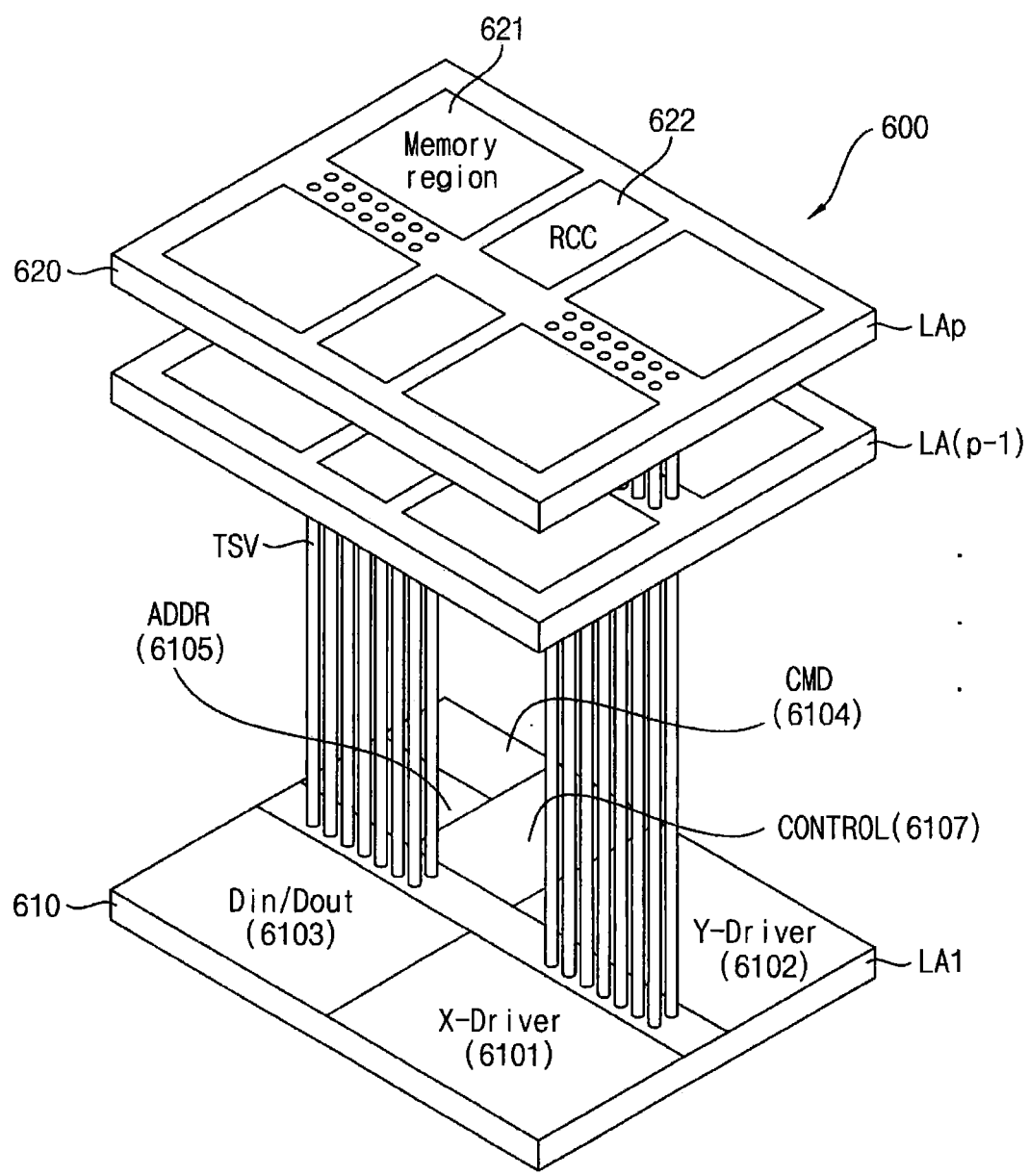
FIG. 13 is a structural diagram illustrating a semiconductor memory device according to example embodiments.

FIG. 13 is a structural diagram illustrating a semiconductor memory device according to example embodiments.

Referring to FIG. 13, a semiconductor memory device 600 may include first through nth semiconductor integrated circuit layers LA1 through LAp (p is an integer greater than two), in which the lowest first semiconductor integrated circuit layer LA1 is assumed to be an interface or control chip and the other semiconductor integrated circuit layers LA2 through LAp are assumed to be slave chips including core memory chips. The first through pth semiconductor integrated circuit layers LA1 through LAp may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAp or 620 as the slave chip.

The first semiconductor integrated circuit layer 610 may include various peripheral circuits for driving memory regions 621 provided in the nth semiconductor integrated circuit layer 620. For example, the first semiconductor integrated circuit layer 610 may include a row (X)-driver 6101 for driving word-lines of a memory, a column (Y)-driver 6102 for driving bit lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged, and each of the plurality of bank arrays may include a plurality of dynamic memory cells as described with reference to FIGS. 4 and 6.

The first semiconductor integrated circuit layer 610 may further include a control logic (or also referred to a control logic circuit) 6107. The control logic 6107 may perform an act, a write and a read operations on the memory region 621 based on a command from a memory controller.

The pth semiconductor integrated circuit layer 620 may include the memory regions 621 including dynamic memory cell arrays and a refresh control circuit 622 that controls a refresh operation of the memory regions 621. The refresh control circuit 622 may replace an auto-refresh operation with a refresh operation during a self-refresh interval to reduce refresh current when the refresh control circuit 622 performs a refresh operation on the memory region 621 under control of the control logic 6107.

Figure 14:
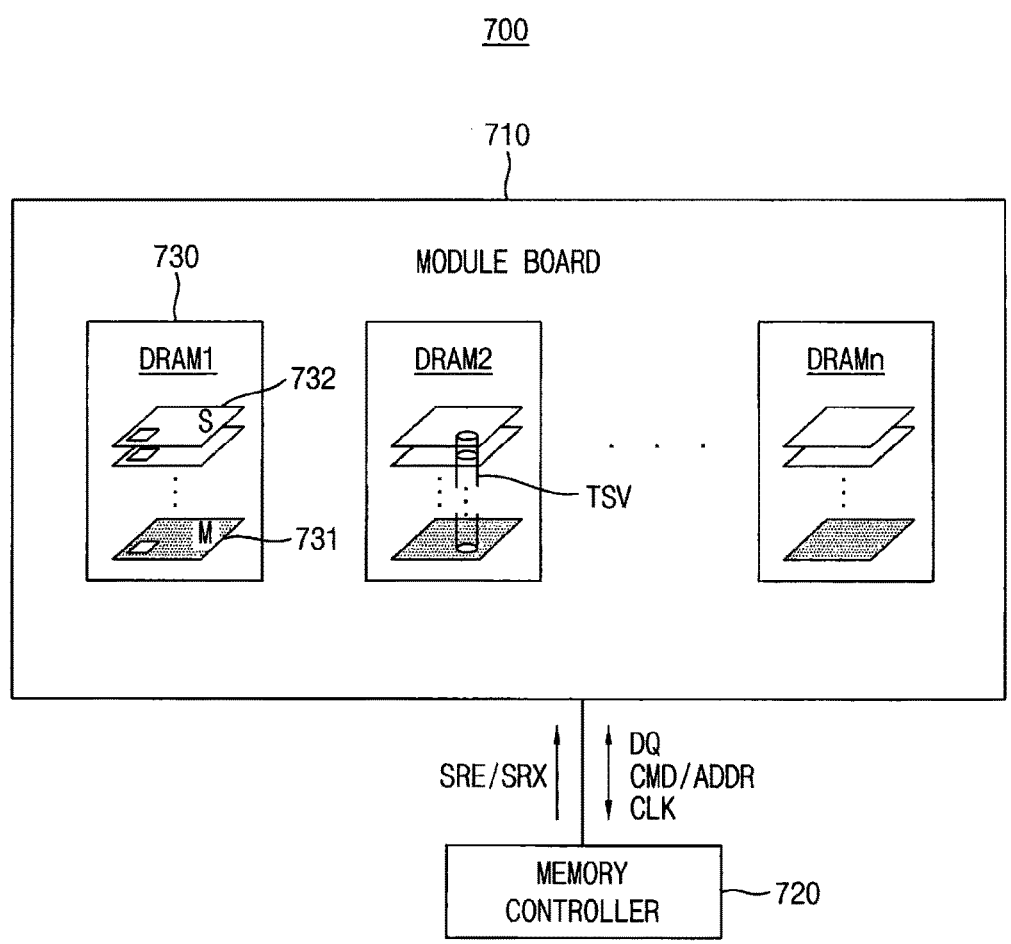
FIG. 14 illustrates a memory system including the semiconductor memory device according to example embodiments.

FIG. 14 illustrates a memory system including the semiconductor memory device according to example embodiments.

Referring to FIG. 14, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 4 and/or of any of the other example embodiments. For example, the semiconductor memory device 730 may be constructed as a DRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200a of FIG. 4 and/or of any of the other example embodiments. Therefore, each of the master chip 731 and the slave chip 732 may include a memory cell array having dynamic memory cells and a refresh control circuit. The refresh control circuit may replace an auto-refresh operation with a refresh operation during a self-refresh interval to reduce refresh current when the refresh control circuit performs a refresh operation on the memory cell array as described with reference to FIGS. 4 to 12 and/or of any of the other example embodiments.

The memory module 710 may communicate with the memory controller 720 via a system bus. Data DQ, a command/address CMD/ADD, and a clock signal CLK may be transmitted and received between the memory module 710 and the memory controller 720 via the system bus. The memory controller 720 may transmit a self-refresh entry command SRE and a self-refresh exit command SRX to the semiconductor memory devices 730. The memory controller 720 may employ the memory controller 100 of FIG. 3.

In addition, in other example embodiments, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe example configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and U.S. Pat. Pub. No. 2011/0233648.

Figure 15:
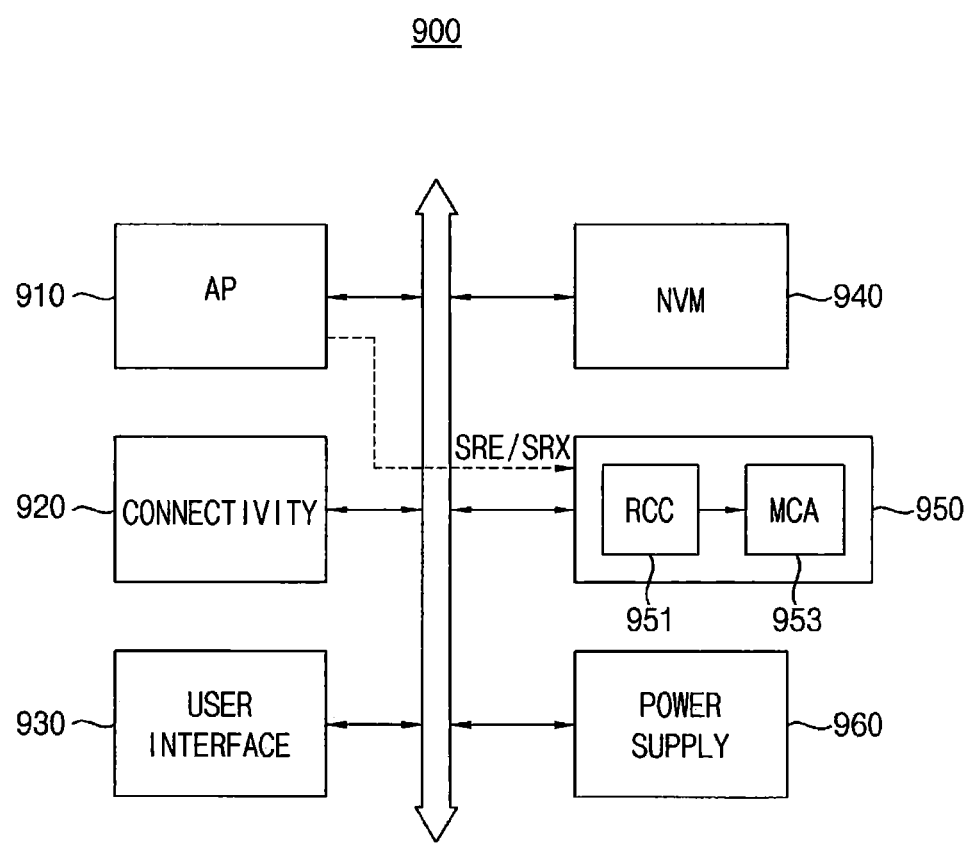
FIG. 15 is a block diagram illustrating a mobile system including a semiconductor memory device according to example embodiments.

FIG. 15 is a block diagram illustrating a mobile system including the semiconductor memory device according to example embodiments.

Referring to FIG. 15, a mobile system 900 may include an application processor 910, a connectivity unit 920, a semiconductor memory device 950, a nonvolatile memory device 940, a user interface 930 and a power supply 960. In some embodiments, the mobile system 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, the connectivity unit 920 may include a baseband chipset that supports communications, such as global system for mobile communications (GSM), general packet radio service (GPRS), wideband code division multiple access (WCDMA), high speed downlink/uplink packet access (HSxPA), etc.

The semiconductor memory device 950 may store data processed by the application processor 910 or operate as a working memory. The semiconductor memory device 950 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc. The semiconductor memory device 950 and/or any other block of FIG. 15 may employ the semiconductor memory device 200a of FIG. 4 and/or any of the other example embodiments. The application processor 910 may apply transmit a self-refresh entry command SRE and a self-refresh exit command SRX to the semiconductor memory device 950. The semiconductor memory device 950 may include a memory cell array 953 including dynamic memory cells and a refresh control circuit 951. Therefore, the refresh control circuit 951 may replace an auto-refresh operation with a refresh operation during a self-refresh interval to reduce refresh current when the refresh control circuit 951 performs a refresh operation on the memory cell array 953 as described with reference to FIGS. 4 to 12 and/or any of the other example embodiments.

The nonvolatile memory device 940 may store a boot image for booting the mobile system 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 may include at least one input device, such as a keypad, a touch screen, etc., and at least one output device, such as a speaker, a display device, etc. The power supply 960 may supply a power supply voltage to the mobile system 900. In some embodiments, the mobile system 900 may further include a camera image processor (CIS), and/or a storage device, such as a memory card, a solid state drive (SSD), a hard disk drive (HDD), a CD-ROM, etc.

In some embodiments, the mobile system 900 and/or components of the mobile system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP) and/or wafer-level processed stack package (WSP).

The present disclosure may be applied to systems using memory controllers and semiconductor memory devices. The present disclosure may be applied to systems such as a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A memory system comprising:
   a semiconductor memory device including a plurality of dynamic memory cells; and
   a memory controller configured to control the semiconductor memory device, wherein the memory controller is configured to perform operations comprising:
   applying an auto-refresh command to the semiconductor memory device at each refresh interval of the semiconductor memory device such that the semiconductor memory performs a refresh operation in a normal mode;
   refraining from applying the auto-refresh command to the semiconductor memory device during a self-refresh interval in which the semiconductor memory device performs a self-refresh operation; and
   adjusting an application of the auto-refresh command in the normal mode responsive to information related to the self-refresh interval, after the semiconductor memory device exits from the self-refresh interval;
   wherein the memory controller comprises:
   a refresh timer configured to generate a refresh clock signal toggling at successive refresh intervals;

a command generator configured to generate the auto-refresh command in synchronization with the refresh clock signal;
a scheduler configured to schedule commands from the command generator, the commands including the auto-refresh command; and
a control circuit configured to control the refresh timer, the command generator and the scheduler,
wherein the command generator is further configured to selectively halt the refresh timer in the self-refresh interval based on a comparison of the refresh interval and the self-refresh interval.

2. The memory system of claim 1, wherein the command generator is further configured to run the refresh timer without interruption when the self-refresh interval is smaller than the refresh interval.

3. The memory system of claim 2, wherein when the semiconductor memory device enters into the self-refresh interval after the semiconductor memory device performs an auto-refresh operation on a first memory cell row of the plurality of dynamic memory cells at a first refresh time, the memory controller is further configured to provide a self-refresh operation on a second memory cell row in the self-refresh interval to replace an auto-refresh operation to be performed on the second memory cell row at a second refresh time after the first refresh time.

4. The memory system of claim 2, wherein when the semiconductor memory device enters into the self-refresh interval after the semiconductor memory device performs an auto-refresh operation on a first memory cell row of the plurality of dynamic memory cells at a first refresh time and the semiconductor memory device exits from the self-refresh interval prior to a second refresh time after the first refresh time, the memory controller is further configured to provide a self-refresh operation on a second memory cell row in the self-refresh interval to replace an auto-refresh operation to be performed on the second memory cell row at the second refresh time.

5. The memory system of claim 1, wherein when the self-refresh interval is smaller than the refresh interval, the command generator is further configured to halt the refresh timer at a first time at which the self-refresh interval exceeds the refresh interval, and is further configured to run the refresh timer again at a second time at which the semiconductor memory device exits from the self-refresh interval.

6. The memory system of claim 5, wherein a sum of a first interval from a first rising transition time of the refresh clock signal immediately before the semiconductor memory device enters into the self-refresh interval to a time when the semiconductor memory device enters into the self-refresh interval and a second interval from the second time to a second rising transition time of the refresh clock signal immediately after the semiconductor memory device exits from the self-refresh interval corresponds to the refresh interval.

7. The memory system of claim 1, wherein the memory controller is further configured to apply a self-refresh entry command to the semiconductor memory device such that the semiconductor memory device performs the self-refresh operation and is further configured to apply a self-refresh exit command to the semiconductor memory device such that the semiconductor memory device exits from the self-refresh interval.

8. A memory system comprising:
a semiconductor memory device including a plurality of dynamic memory cells; and
a memory controller configured to control the semiconductor memory device, wherein the memory controller is configured to perform operations comprising:
applying an auto-refresh command to the semiconductor memory device at each refresh interval of the semiconductor memory device such that the semiconductor memory performs a refresh operation in a normal mode;
refraining from applying the auto-refresh command to the semiconductor memory device during a self-refresh interval in which the semiconductor memory device performs a self-refresh operation; and
adjusting an application of the auto-refresh command in the normal mode responsive to information related to the self-refresh interval, after the semiconductor memory device exits from the self-refresh interval;
wherein the semiconductor memory device comprises:
a memory cell array including a plurality of bank arrays having the plurality of dynamic memory cells;
a control logic circuit configured to control an access to the memory cell array based on a command from the memory controller;
a refresh control circuit configured to perform the refresh operation on the plurality of dynamic memory cells under control of the control logic circuit; and
wherein the refresh control circuit comprises:
an oscillator configured to generate a clock signal in response to a self-refresh entry signal from the control logic circuit and configured to be disabled in response to a self-refresh exit signal from the control logic circuit;
a refresh clock generator configured to generate a refresh clock signal in response to one of an auto-refresh signal from the control logic circuit and the clock signal; and
a refresh counter configured to generate a refresh row address designating a memory cell row to be refreshed in response to the refresh clock signal.

9. The memory system of claim 8, wherein the oscillator is configured to provide the clock signal to the refresh clock generator in the self-refresh interval.

10. The memory system of claim 8, wherein a refresh operation performed in response to the auto-refresh command and the self-refresh operation correspond to an all bank refresh operation performed on the plurality of bank arrays, and
the memory cell array is a three-dimensional memory cell array.

* * * * *